(12) United States Patent
Nakashima

(10) Patent No.: US 8,486,820 B2
(45) Date of Patent: Jul. 16, 2013

(54) SEMICONDUCTOR DEVICE MANUFACTURING METHOD

(75) Inventor: Fuminobu Nakashima, Kumamoto (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/350,323

(22) Filed: Jan. 13, 2012

(65) Prior Publication Data

US 2012/0190186 A1  Jul. 26, 2012

(30) Foreign Application Priority Data

Jan. 20, 2011 (JP) ................................ 2011-010205

(51) Int. Cl.
  *H01L 21/44* (2006.01)
(52) U.S. Cl.
  USPC ............................ 438/597; 438/618; 438/622
(58) Field of Classification Search
  USPC ................. 438/597, 618, 622, 624, 626, 647, 438/668, 688
  See application file for complete search history.

(56) References Cited

U.S. PATENT DOCUMENTS

| 5,268,333 | A  | * | 12/1993 | Lee et al. | 438/698 |
| 6,117,798 | A  | * | 9/2000 | Fang et al. | 438/782 |
| 6,169,026 | B1 | * | 1/2001 | Park et al. | 438/632 |
| 6,511,923 | B1 | * | 1/2003 | Wang et al. | 438/783 |
| 7,199,053 | B2 | * | 4/2007 | Jung | 438/689 |

FOREIGN PATENT DOCUMENTS

| JP | 8-255791 A | 10/1996 |
| JP | 11-40669 A | 2/1999 |
| JP | 11-176936 A | 7/1999 |
| JP | 2000-91431 A | 3/2000 |

* cited by examiner

*Primary Examiner* — Kevin M Picardat
(74) *Attorney, Agent, or Firm* — Foley & Lardner LLP

(57) ABSTRACT

A semiconductor device manufacturing method includes: forming a first insulating film over the surface of a semiconductor substrate having at least two adjacent protrusions in such a manner that the film thickness between the two protrusions is not less than 1.2 times the height of at least one of the two protrusions; and forming a second insulating film over the first insulating film, the second insulating film being harder than the first insulating film.

10 Claims, 6 Drawing Sheets

SEMICONDUCTOR DEVICE MANUFACTURING METHOD

CROSS-REFERENCE TO RELATED APPLICATIONS

The disclosure of Japanese Patent Application No. 2011-10205 filed on Jan. 20, 2011 including the specification, drawings, and abstract is incorporated herein by reference in its entirety.

BACKGROUND

The present invention relates to a semiconductor device manufacturing method.

Various studies have been conducted on the manufacture of interlayer insulating film for covering wiring in order, for instance, to increase the degree of integration of a semiconductor device. Technologies concerning the manufacture of interlayer insulating film are described, for instance, in Japanese Patent Application Publications No. Hei 11 (1999)-40669, Hei 11 (1999)-176936, Hei 8 (1996)-255791, and 2000-91431. The technology described in Japanese Patent Application Publication No. Hei 11 (1999)-40669 forms an upper insulating film layer, which includes an insulating film etching component, over a lower insulating film layer. The technology described in Japanese Patent Application Publication No. Hei 11 (1999)-176936 forms an insulating film, etches the insulating film, and then forms another insulating film. Japanese Unexamined Patent Application Publications No. Hei 11 (1999)-40669 and Hei 11 (1999)-176936 state that wiring formed over a semiconductor substrate prevents a void from being generated in the interlayer insulating film.

The technology described in Japanese Patent Application Publication No. Hei 8 (1996)-255791 forms a BPSG film over a silicon substrate, over which a titanium silicide film is formed, via an oxide silicon film. The publication states that the technology can suppress an increase in the resistance value of the titanium silicide film. The technology described in Japanese Patent Application Publication No. 2000-91431 forms a BPSG film or other similar interlayer insulating film over a silicon substrate and then forms a plasma TEOS film or other similar interlayer insulating film made of a harder material. The publication states that the technology can form a sufficiently planar interlayer insulating film.

SUMMARY

It is necessary that the interlayer insulating film be formed by using a hard insulating film. However, a hard interlayer insulating film does not properly fill surface irregularities (protrusions and recesses). Therefore, when the interlayer insulating film is formed over an irregular surface, a void may be generated in the interlayer insulating film.

According to one aspect of the present invention, there is provided a semiconductor device manufacturing method. The semiconductor device manufacturing method includes the steps of: forming a first insulating film over the surface of an underlying film having at least two adjacent protrusions in such a manner that the film thickness between the two protrusions is not less than half the height of at least one of the two protrusions; and forming a second insulating film over the first insulating film, the second insulating film being harder than the first insulating film.

According to another aspect of the present invention, the first insulating film formed over the underlying film is such that the film thickness between the two adjacent protrusions of the underlying film is not less than 1.2 times the height of at least one of the two protrusions. Thus, the first insulating film has more moderate protrusions and recesses than the two protrusions. Further, the second insulating film, which is harder than the first insulating film, is formed over the first insulating film. Therefore, the hard second insulating film is formed over the protrusions and recesses that are more moderate than the two protrusions. This makes it possible to prevent a void from being generated in the interlayer insulating film while the surface insulating film is hard.

According to the aspects of the present invention, it is possible to prevent a void from being generated in the interlayer insulating film, thereby increasing the manufacturing yield of a semiconductor device.

BRIEF DESCRIPTION OF THE DRAWINGS

Preferred Embodiments of the present invention will be described in detail based on the following figures, in which.

DETAILED DESCRIPTION

Figure 1:
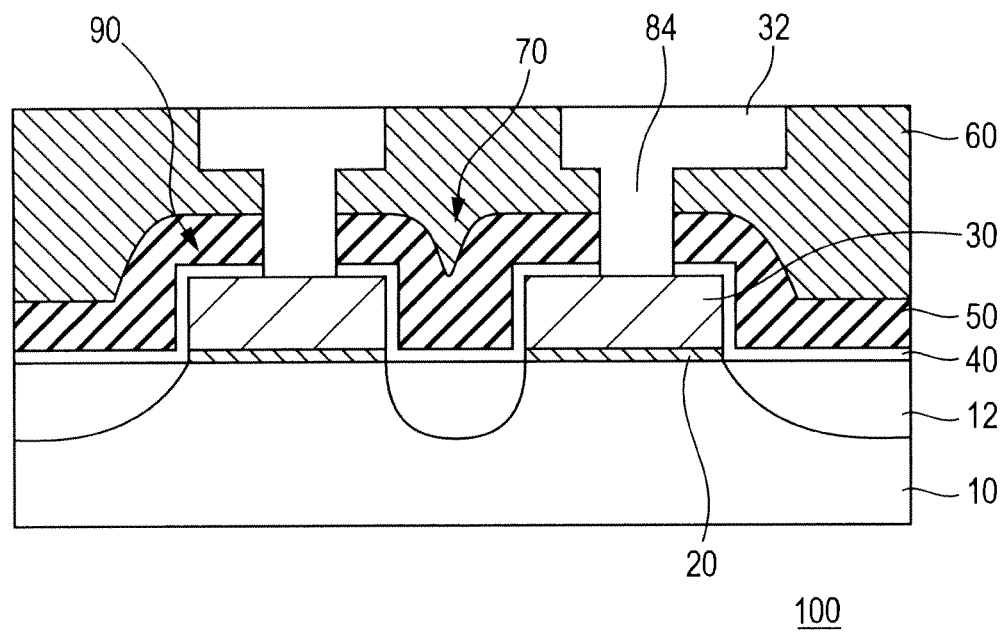
FIG. 1 is a cross-sectional view illustrating a semiconductor device according to a first embodiment of the present invention.

Preferred Embodiments of the present invention will now be described with reference to the accompanying drawings. Like elements in the drawings are designated by the same reference numerals and will not be redundantly described.

FIG. 1 is a cross-sectional view illustrating a semiconductor device 100 according to a first embodiment of the present invention. FIGS. 2 to 5 are cross-sectional views illustrating a method of manufacturing the semiconductor device 100 shown in FIG. 1. The method of manufacturing the semiconductor device 100 includes a process of forming an insulating film 50 over the surface of a semiconductor substrate 10 and a process of forming another insulating film 60 over the insulating film 50.

One surface of the semiconductor substrate 10 has at least two protrusions 90. The two protrusions are positioned adjacent to each other. In the process of forming the insulating film 50, the insulating film 50 is formed in such a manner that the film thickness between the two protrusions 90 is 1.2 or more times the height of at least one of the two protrusions 90. The insulating film 60 is harder than the insulating film 50.

The configuration of the semiconductor device 100 and the method of manufacturing the semiconductor device 100 will be described in detail below.

First of all, the configuration of the semiconductor device 100 will be described with reference to FIG. 1. As shown in FIG. 1, the semiconductor device 100 includes a semiconductor substrate 10, an insulating film 20, wiring 30, an etching stopper film 40, an insulating film 50, an insulating film 60, a contact 84, and wiring 32. A diffusion layer 12 is formed over the semiconductor substrate 10. The semiconductor substrate 10 is, for example, a silicon substrate. The wiring 30 is formed over a region of the semiconductor substrate 10, over which the diffusion layer 12 is formed, via the insulating film 20. The wiring 30 is, for example, gate wiring and made of polysilicon. The insulating film 20 is, for example, a gate insulating film and made of silicon dioxide film.

The etching stopper film 40 is formed over the semiconductor substrate 10 and the wiring 30. The etching stopper film 40 is made, for instance, of SiN. The protrusions 90 are configured by the insulating film 20, the wiring 30, and the etching stopper film 40, which are formed over the semiconductor substrate 10. The heights of the protrusions 90 are, for example, 4900 Å or more. The spacing interval between the two protrusions 90 is, for example, 7000 Å or less. The insulating film 50 is formed over the etching stopper film 40. The insulating film 50 is, for example, a PSG film or a BPSG film. The insulating film 50 does not have a planar portion between the protrusions 90. The insulating film 60 is formed over the insulating film 50. The insulating film 60 is made, for instance, of $SiO_2$. The wiring 32 is disposed in the insulating film 60. The contact 84 is disposed in the insulating film 50 and the insulating film 60 in such a manner as to couple the wiring 32 to the wiring 30. The wiring 32 is made, for instance, of W.

Next, the method of manufacturing the semiconductor device 100 will be described with reference to FIGS. 1 to 6. First of all, the insulating film 20 is formed over the semiconductor substrate 10. The insulating film 20 is formed, for example, by means of thermal oxidation. Next, a conductive film is formed over the insulating film 20. Next, a resist pattern is formed over the conductive film. The conductive film is then etched by using the resist pattern as a mask. As a result, the wiring 30 is formed over the insulating film 20. Next, impurity ions are injected into the semiconductor substrate 10 to form the diffusion layer 12. Next, the etching stopper film 40 is formed over the semiconductor substrate 10 and over the wiring 30. The insulating film 50 is then formed over the etching stopper film 40. Consequently, the structure shown in FIG. 2 is obtained.

Figure 2:
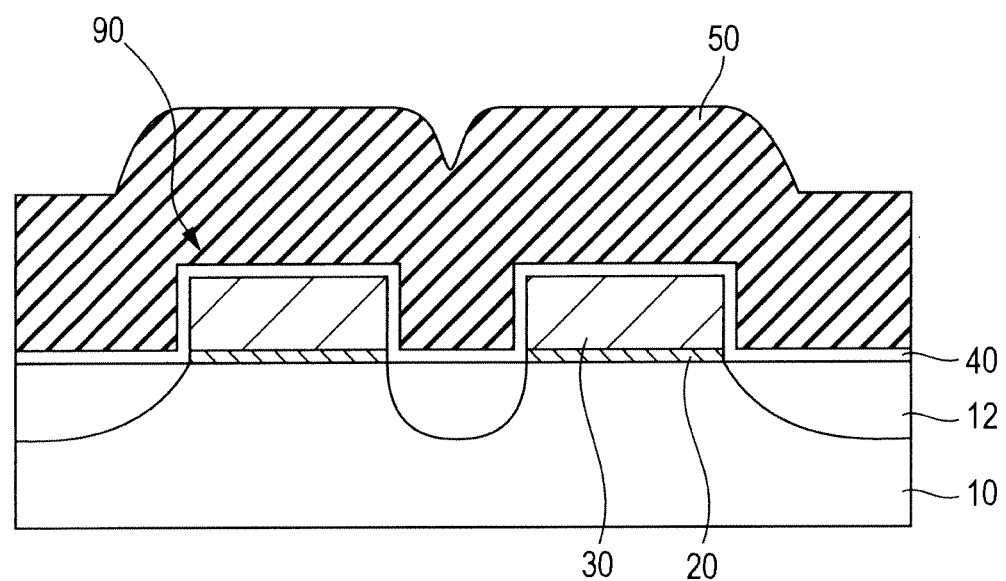
FIG. 2 is a cross-sectional view illustrating a method of manufacturing the semiconductor device shown in FIG. 1.

At a stage shown in FIG. 2, the thickness of the insulating film 50 between the two protrusions 90 is 1.2 or more times the height of at least one of the two protrusions 90, and is, for example, 6500 Å. In this case, moderate protrusions and recesses are formed over the surface of the insulating film 50. In this instance, the insulating film 50 does not have a planar portion between the two protrusions 90. It is further preferred that the thickness of the insulating film 50 be 1.3 or more times the height of at least one of the two protrusions 90.

Figure 3:
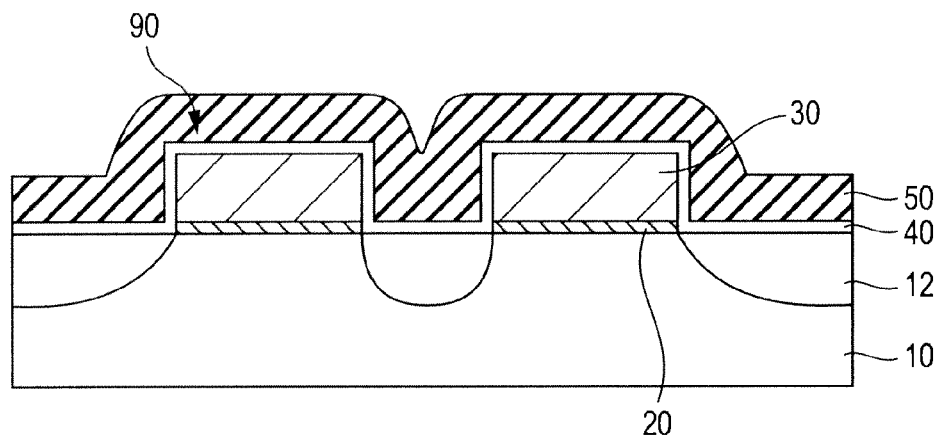
FIG. 3 is a cross-sectional view illustrating the method of manufacturing the semiconductor device shown in FIG. 1.

Next, the insulating film 50 is thinned as shown in FIG. 3. In this instance, the insulating film 50 is thinned in such a manner that the insulating film 50 will not be exposed when CMP (chemical mechanical polishing) is performed later (see FIG. 5). As the surface of an unthinned insulating film 50 has moderate protrusions and recesses, the surface of the thinned insulating film 50 also has moderate protrusions and recesses. The insulating film 50 is thinned, for example, by etching back the entire surface of the insulating film 50 by means of wet etching. As wet etching is isotropic etching, the surface of the thinned insulating film 50 is more planarized than the surface of the unthinned one.

Figure 4:
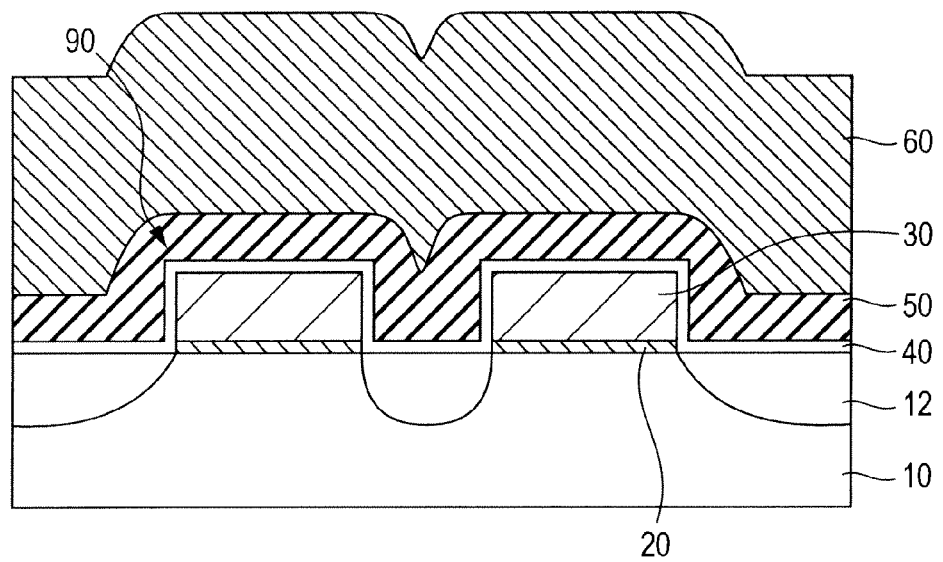
FIG. 4 is a cross-sectional view illustrating the method of manufacturing the semiconductor device shown in FIG. 1.

Next, the insulating film 60 harder than the insulating film 50 is formed over the insulating film 50 as shown in FIG. 4. The surface of the insulating film 50 has moderate protrusions and recesses. Further, the insulating film 50 does not have a planar portion between the two protrusions 90. Therefore, no nondense portion is formed in the insulating film 60. The term "nondense portion" denotes a portion having a lower film density than the remaining portion of the insulating film 60.

Figure 5:
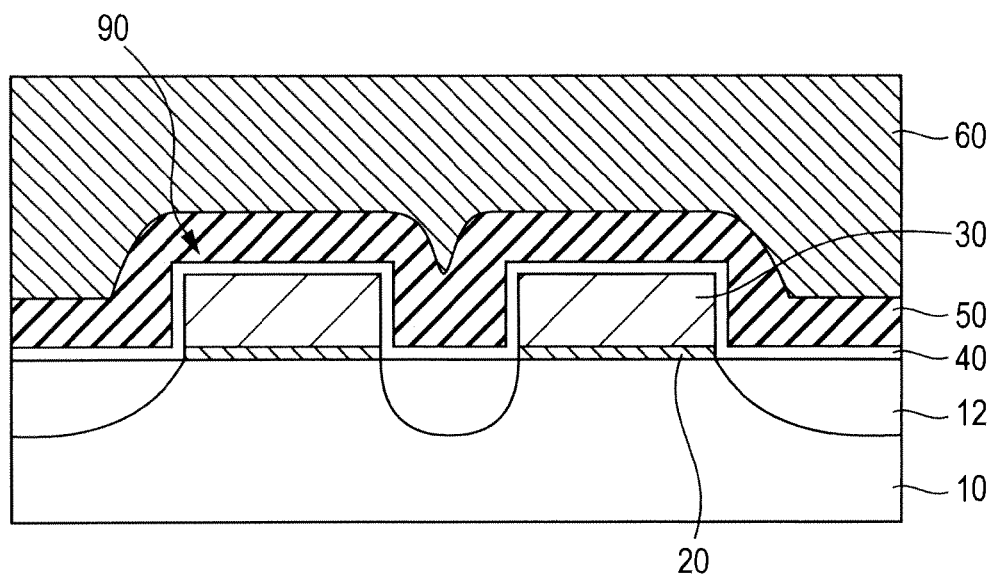
FIG. 5 is a cross-sectional view illustrating the method of manufacturing the semiconductor device shown in FIG. 1.

Next, the surface of the insulating film 60 is planarized by CMP as shown in FIG. 5. As the insulating film 60 is hard, it will not easily be scratched by CMP. Next, the contact and wiring 32 to be coupled to the wiring 30 are formed through the insulating film 50 and the insulating film 60 as shown in FIG. 1. The wiring 32 is formed, for example, by a damascene method.

Figure 8:
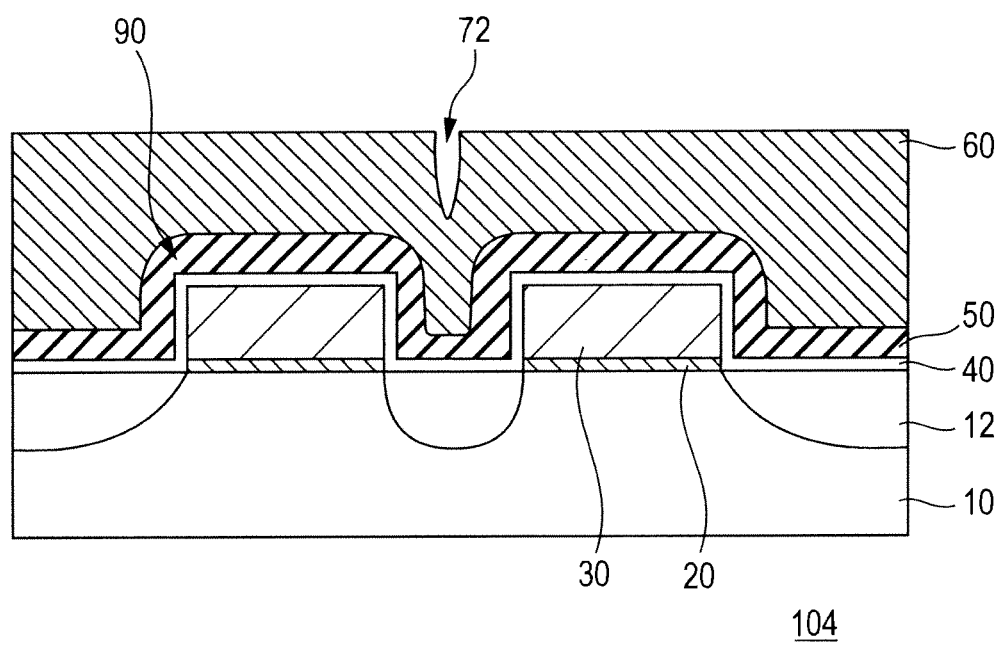
FIG. 8 is a cross-sectional view illustrating a semiconductor device according to a comparative example.
Figure 9:
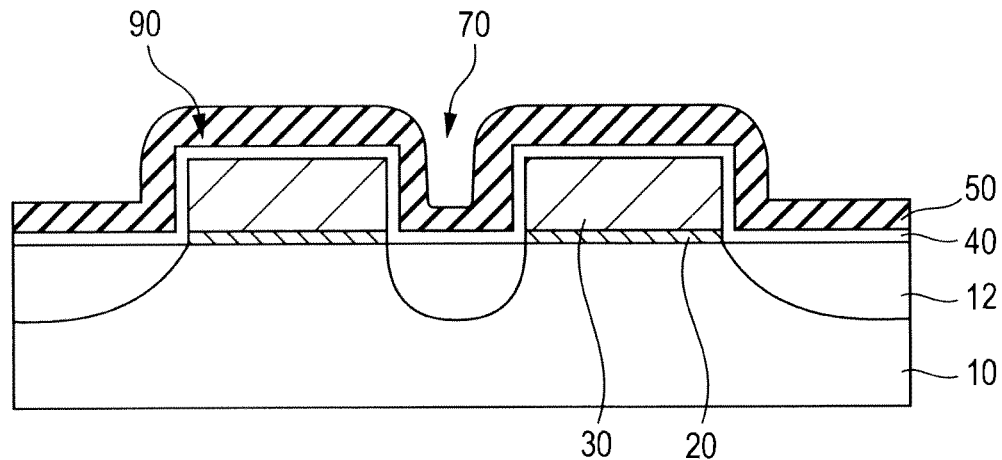
FIG. 9 is a cross-sectional view illustrating a method of manufacturing the semiconductor device shown in FIG. 8.
Figure 10:
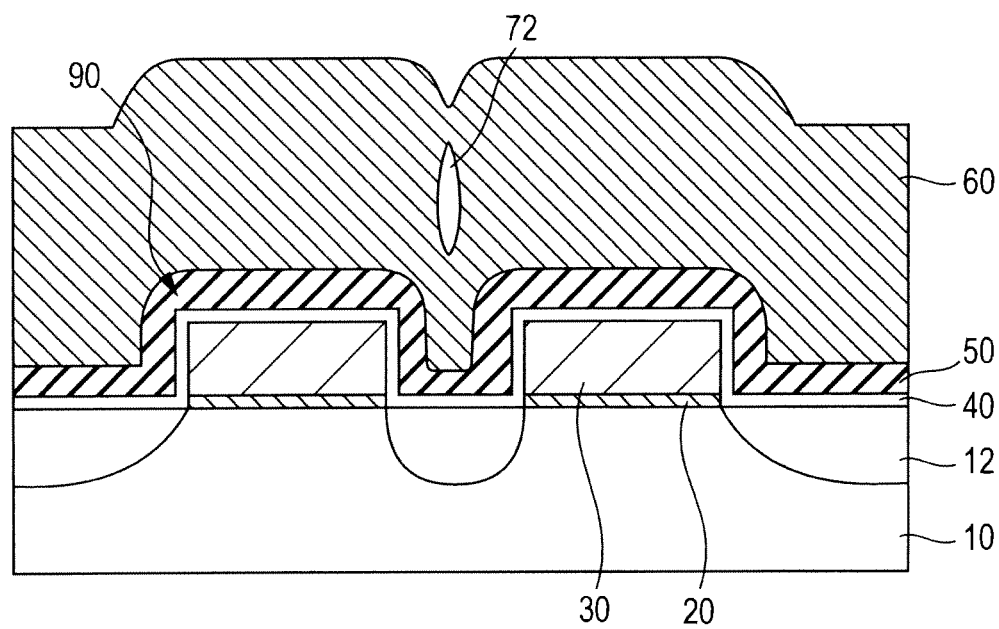
FIG. 10 is a cross-sectional view illustrating the method of manufacturing the semiconductor device shown in FIG. 8.
Figure 11:
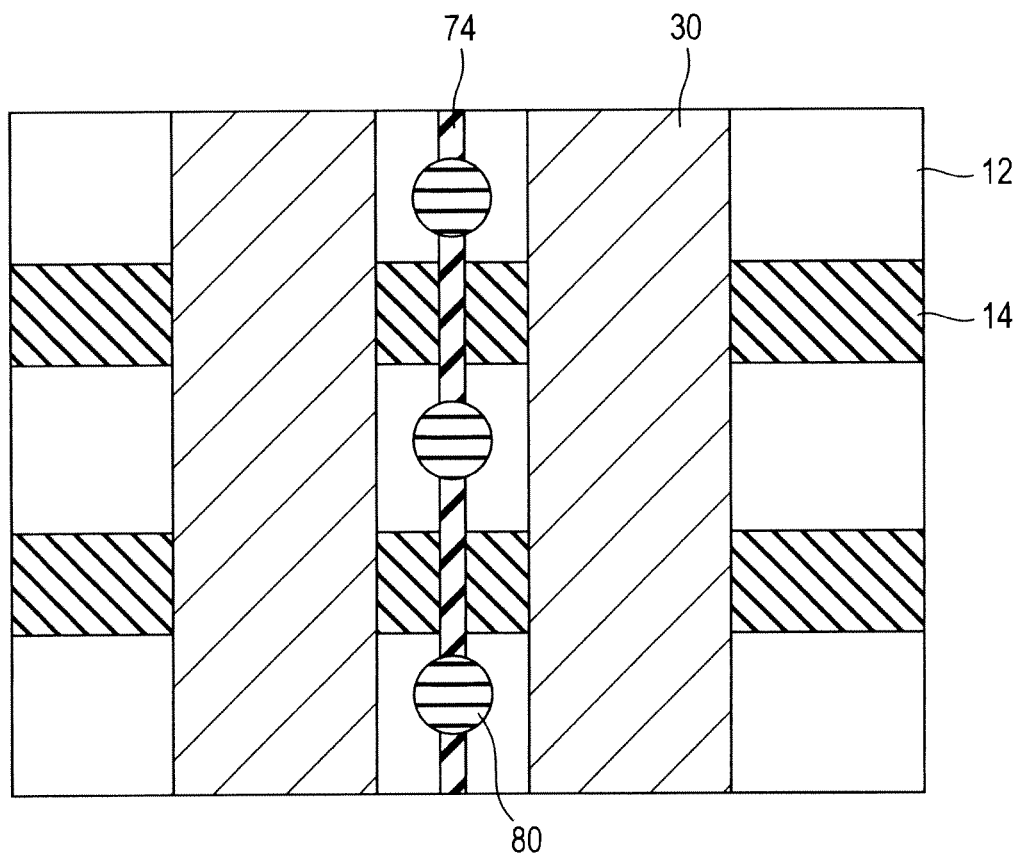
FIG. 11 is a plan view illustrating the semiconductor device shown in FIG. 8.

Advantages of the present embodiment will now be described. FIG. 8 is a cross-sectional view illustrating a semiconductor device 104 according to a comparative example. FIGS. 9 and 10 are cross-sectional views illustrating a method of manufacturing the semiconductor device 104 shown in FIG. 8. FIG. 11 is a plan view illustrating the semiconductor device 104 shown in FIG. 8 and is a schematic diagram illustrating a problem with the comparative example. First of all, the method of manufacturing the semiconductor device 104 forms the insulating film 50 as shown in FIG. 9. In this instance, the thickness of the insulating film 50 between the two protrusions 90 is not more than half the heights of the two protrusions 90. Next, the insulating film 60 is formed over the insulating film 50 as shown in FIG. 10. Subsequently, the insulating film 60 is planarized by CMP (FIG. 8).

The method of manufacturing the semiconductor device 104 according to the comparative example is such that in the process of forming the insulating film 50, the thickness of the insulating film 50 between the two protrusions 90 is less than 1.2 times the heights of the two protrusions 90. Therefore, the thickness of the insulating film 50 is not adequate for filling a gap between the two protrusions 90. Thus, a large recess 70 is formed in a portion of the surface of the insulating film 50 that is located between the two protrusions 60. The hard insulating film 60 does not properly fill the recess 70. Therefore, when the insulating film 60 is formed over the insulating film 50, a nondense portion 72 is generated in a portion of the insulating film 60 that is located above the recess 70. Particularly when the recess 70 has a flat portion, the generated nondense portion 72 is conspicuous. If the nondense portion 72 is generated, it is etched when a contact, a through-hole, or the like is formed. Consequently, a void 74 may be generated in an interlayer insulating film as shown in FIG. 11. If a conductive substance is formed in the void 74, adjacent contacts 80 and through-holes formed over transistors separated, for instance, by an element isolation region 14 are brought into conduction. In this instance, the semiconductor device turns out to be defective, thereby decreasing a semiconductor device manufacturing yield.

According to the present embodiment, on the other hand, the insulating film 50 formed over the semiconductor device 10 in such a manner that its thickness between the two protrusions 90 is not less than 1.2 times the height of at least one of the two protrusions 90. In this case, the gap between the two protrusions 90 is adequately filled by the insulating film 50 in the process of forming the insulating film 50. Therefore, the recess 70 formed in the insulating film 50 is small so that the surface of the insulating film 50 has more moderate protrusions and recesses than the two protrusions 90. Further, the recess 70 has no planar portion. In this instance, the hard insulating film 60 is formed over protrusions and recesses that are more moderate than the two protrusions 90. Consequently, no nondense portion is generated in the interlayer insulating film. This makes it possible to harden the surface insulating film, prevent the generation of a void in the interlayer insulating film, and increase the manufacturing yield of a semiconductor device.

Figure 6:
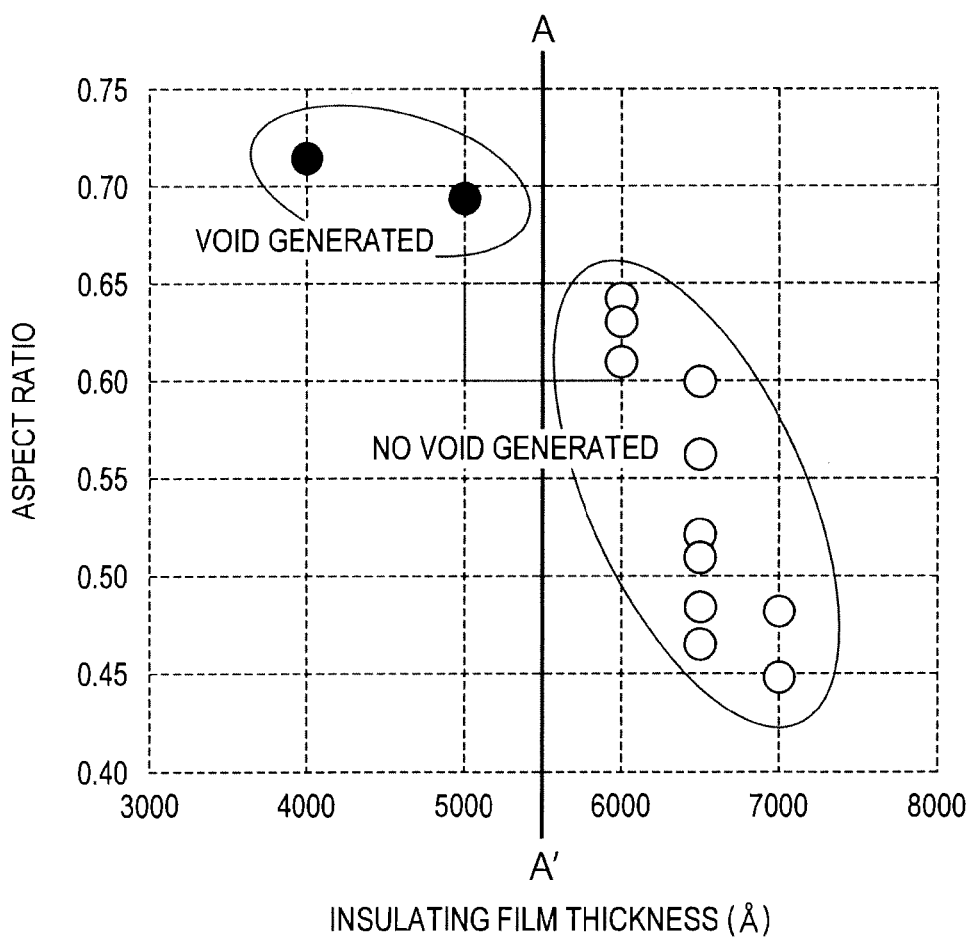
FIG. 6 is a graph illustrating the correlation between the thickness and aspect ratio of an insulating film.
Figure 7:
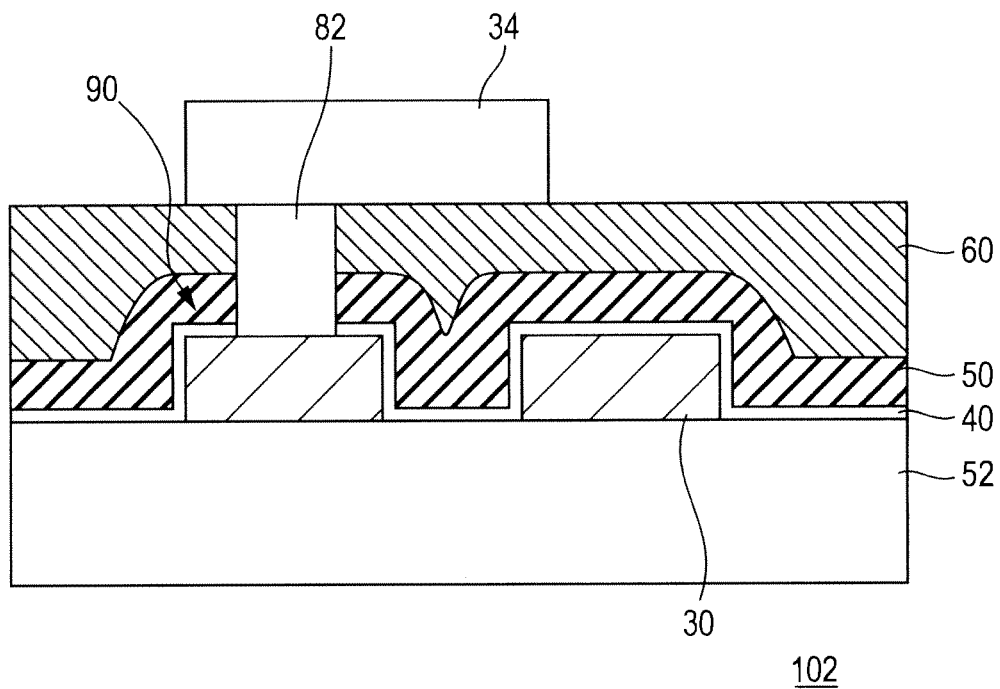
FIG. 7 is a cross-sectional view illustrating a semiconductor device according to a second embodiment of the present invention.

FIG. 6 is a graph illustrating the correlation between the thickness and aspect ratio of the insulating film 50. The aspect ratio is a value that is obtained by dividing the depth of the recess 70 by the spacing interval between the two protrusions 90. In other words, the lower the aspect ratio, the moderate the protrusions and recesses of the insulating film 50. As shown in FIG. 6, when the thickness of the insulating film 50 is not more than 5000 Å, the aspect ratio is high so that a void is generated in the interlayer insulating film. When, on the other hand, the thickness of the insulating film 50 is not less than 6000 Å, the aspect ratio is low so that no void is generated in the interlayer insulating film. As described above, the aspect ratio decreases with an increase in the thickness of the insulating film 50. A decrease in the aspect ratio inhibits the generation of a void in the interlayer insulating film. In the case shown in FIG. 6, the heights of the protrusions formed over the semiconductor substrate are 4900 Å. At a point at which the thickness of the insulating film 50 is not less than 5880 Å, therefore, the thickness of the insulating film 50 is not less than 1.2 times the height of at least one of the two protrusions 90. Consequently, a point at which the thickness of the insulating film 50 shown in FIG. 7 is not less than 5880 Å (a point positioned to the right of line A-A' in FIG. 7) corresponds to the semiconductor device 100 according to the present embodiment. It means that the semiconductor device manufacturing method according to the present embodiment prevents the generation of a void. It should be noted that all measurement results shown in FIG. 6 are obtained when the heights of the protrusions 90 are 4900 Å and the spacing interval between the protrusions 90 is 7000 Å.

According to the present embodiment, the insulating film 50 is thinned after it is formed. When the insulating film 50 is formed, it has moderate protrusions and recesses. Therefore, even after it is thinned, it has moderate protrusions and recesses. Therefore, it is possible to thin a semiconductor device and increase its manufacturing yield.

Further, if the interlayer insulating film is a BPSG film or other soft film in a situation where it is polished and planarized by means of CMP, it may become scratched. If wiring is formed over a scratched interlayer insulating film, wires may be short-circuited or otherwise damaged to decrease the manufacturing yield of a semiconductor device. According to the present embodiment, on the other hand, the hard insulating film 60 is polished in a planarization process. Hence, scratches are not easily generated by CMP. This makes it possible to further increase the manufacturing yield of a semiconductor device.

FIG. 7 is a cross-sectional view illustrating a semiconductor device 102 according to a second embodiment of the present invention. FIG. 7 corresponds to FIG. 1, which depicts the first embodiment. The semiconductor device 102 according to the second embodiment is similar to the semiconductor device 100 according to the first embodiment except that the wiring 30 is Al wiring formed over an interlayer insulating film. In addition, the method of manufacturing the semiconductor device 102 according to the second embodiment is the same as the method of manufacturing the semiconductor device 100 according to the first embodiment.

As shown in FIG. 7, the wiring 30 is formed over an insulating film 52. The insulating film 52 is an interlayer insulating film and made, for instance, of $SiO_2$. The wiring 30 is Al wiring. A via plug 82 is formed over the wiring 30 and coupled to the wiring 30 through the insulating film 50 and the insulating film 60. Further, wiring 34 is formed over the insulating film 60 and the via plug 82, and coupled to the via plug 82. The via plug 82 is made, for instance, of W. The wiring 34 is, for example, Al wiring or W wiring.

The second embodiment provides the same advantages as the first embodiment.

Although specific embodiments have been described with reference to the accompanying drawings, they are merely described as illustrative examples of the present invention and are not intended to be limiting. Those skilled in the art will readily appreciate that various modifications and changes can be applied to the embodiments without departing from the scope and spirit of the present invention as defined in and by the appended claims.

What is claimed is:

1. A semiconductor device manufacturing method comprising:
    forming a first insulating film over the surface of an underlying film having at least two adjacent protrusions in such a manner that the film thickness at all points between the two protrusions is not less than 1.2 times the height of at least one of the two protrusions; and
    forming a second insulating film over the first insulating film, the second insulating film being harder than the first insulating film.

2. The semiconductor device manufacturing method according to claim 1, further comprising:
    thinning the first insulating film after the step of forming the first insulating film and before the step of forming the second insulating film.

3. The semiconductor device manufacturing method according to claim 2, wherein the thinning is performed by means of wet etching.

4. The semiconductor device manufacturing method according to claim 1, further comprising:
    planarizing the second insulating film after the step of forming the second insulating film.

5. The semiconductor device manufacturing method according to claim 4, wherein the planarizing is performed by means of CMP.

6. The semiconductor device manufacturing method according to claim 1, wherein the first insulating film is a BPSG film or a PSG film.

7. The semiconductor device manufacturing method according to claim 1, wherein the second insulating film is a $SiO_2$ film.

8. The semiconductor device manufacturing method according to claim 1, further comprising:
    forming a wiring pattern over the underlying film before the step of forming the first insulating film; and
    wherein the protrusions are configured by the wiring pattern.

9. The semiconductor device manufacturing method according to claim 1, wherein the underlying film is a semiconductor substrate; and wherein the protrusions are made of polysilicon.

10. The semiconductor device manufacturing method according to claim 1, wherein the underlying film is an interlayer insulating film; and wherein the protrusions are configured by Al wiring.

* * * * *